(12) United States Patent  
Johnson et al.

(10) Patent No.: US 9,131,624 B1  
(45) Date of Patent: Sep. 8, 2015

(54) RACK-MOUNTABLE IT DEVICE

(71) Applicant: EMC Corporation, Hopkinton, MA (US)

(72) Inventors: Keith C. Johnson, Medway, MA (US); Ralph C. Frangioso, Franklin, MA (US); Robert P. Wierzbicki, Worcester, MA (US); W. Brian Cunningham, Westborough, MA (US); Michael Gregoire, Waltham, MA (US); Justin P. Bandholz, Apex, NC (US); Jiabing Li, Cary, NC (US)

(73) Assignee: EMC Corporation, Hopkinton, MA (US)

( * ) Notice: Subject to any disclaimer, the term of this patent is extended or adjusted under 35 U.S.C. 154(b) by 42 days.

(21) Appl. No.: 14/042,142

(22) Filed: Sep. 30, 2013

(51) Int. Cl.
    *G06F 1/16* (2006.01)
    *H05K 7/18* (2006.01)
    *H05K 7/14* (2006.01)

(52) U.S. Cl.
    CPC .............. *H05K 7/183* (2013.01); *H05K 7/1489* (2013.01)

(58) Field of Classification Search
    USPC ............ 165/104.21, 47, 287, 104.14, 104.33; 248/74.1, 201, 324; 360/97.15, 97.19, 360/69, 98–1, 92.1, 72–1, 72.2, 72.3, 133; 29/428, 825, 592.1, 401.1, 402.08, 29/469, 888.02; 312/236, 330.1, 223.1, 312/223.2, 334.8, 223.6, 326, 334.11, 312/265.1, 265.3, 333, 107.5, 111; 361/694, 695, 679.46, 679.02, 679.33, 361/679.31, 679.32, 679.34, 679.42, 361/679.53, 679.5, 679.48, 679.08, 679.47, 361/679.49, 679.4, 679.38, 679.35, 679.39
    See application file for complete search history.

(56) References Cited

U.S. PATENT DOCUMENTS

| | | | |
|---|---|---|---|
| 7,525,797 B2 * | 4/2009 | Coglitore et al. | 361/679.46 |
| 7,599,183 B2 * | 10/2009 | Dittus et al. | 361/695 |
| 2012/0152298 A1 * | 6/2012 | Casali et al. | 136/212 |

* cited by examiner

*Primary Examiner* — Hung Duong
(74) *Attorney, Agent, or Firm* — Brian J. Colandreo; Mark H. Whittenberger; Holland & Knight LLP

(57) ABSTRACT

An IT chassis, configured to house IT componentry, includes a forward portion having a forward portion width and a rearward portion having a rearward portion width that is narrower than the forward portion width. A first side of the rearward portion is configured to engage a first slide assembly having a first slide width. A second side of the rearward portion is configured to engage a second slide assembly having a second slide width. The sum of the rearward portion width, the first slide width and the second slide width is substantially equal to the forward portion width.

26 Claims, 3 Drawing Sheets

(top view)

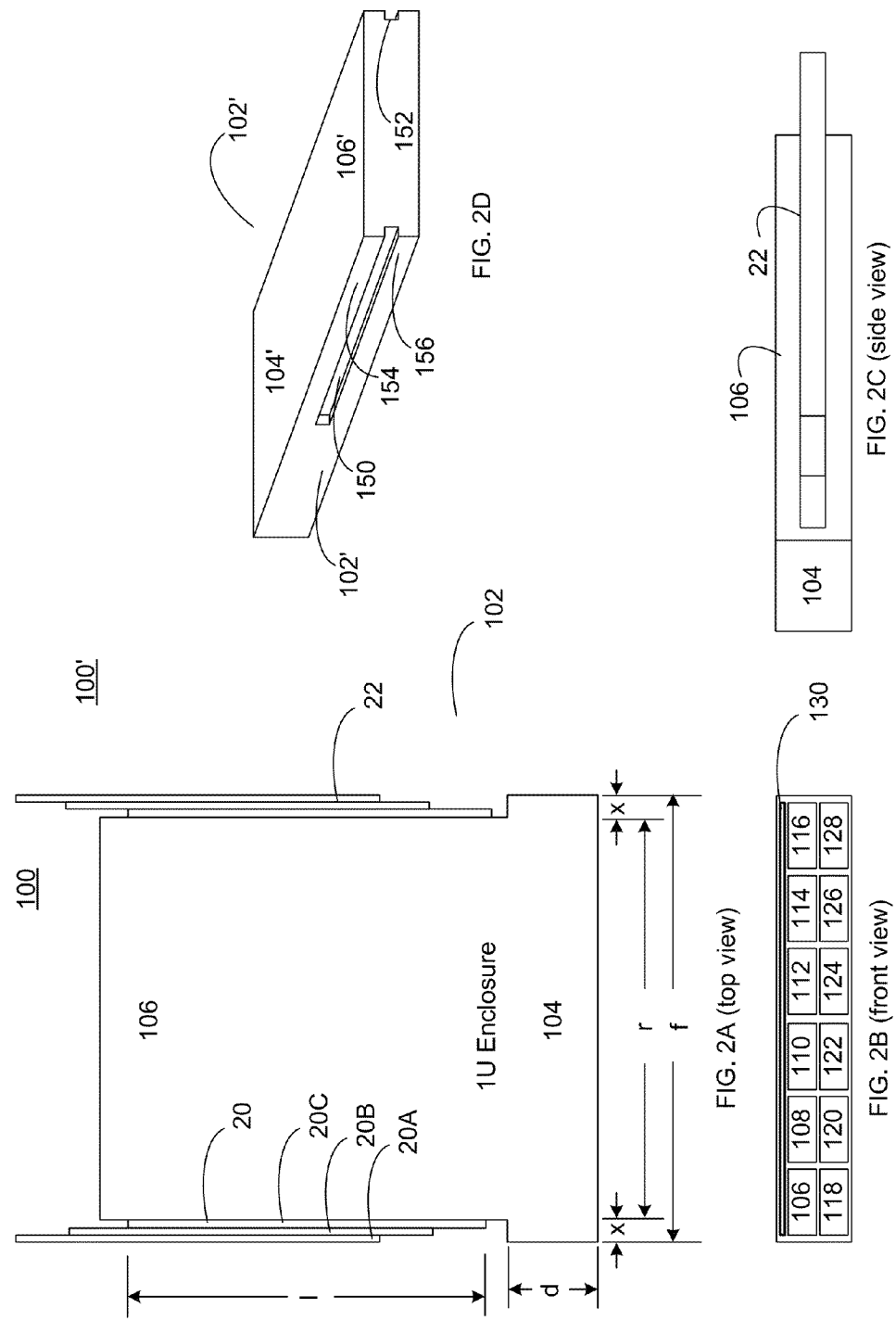

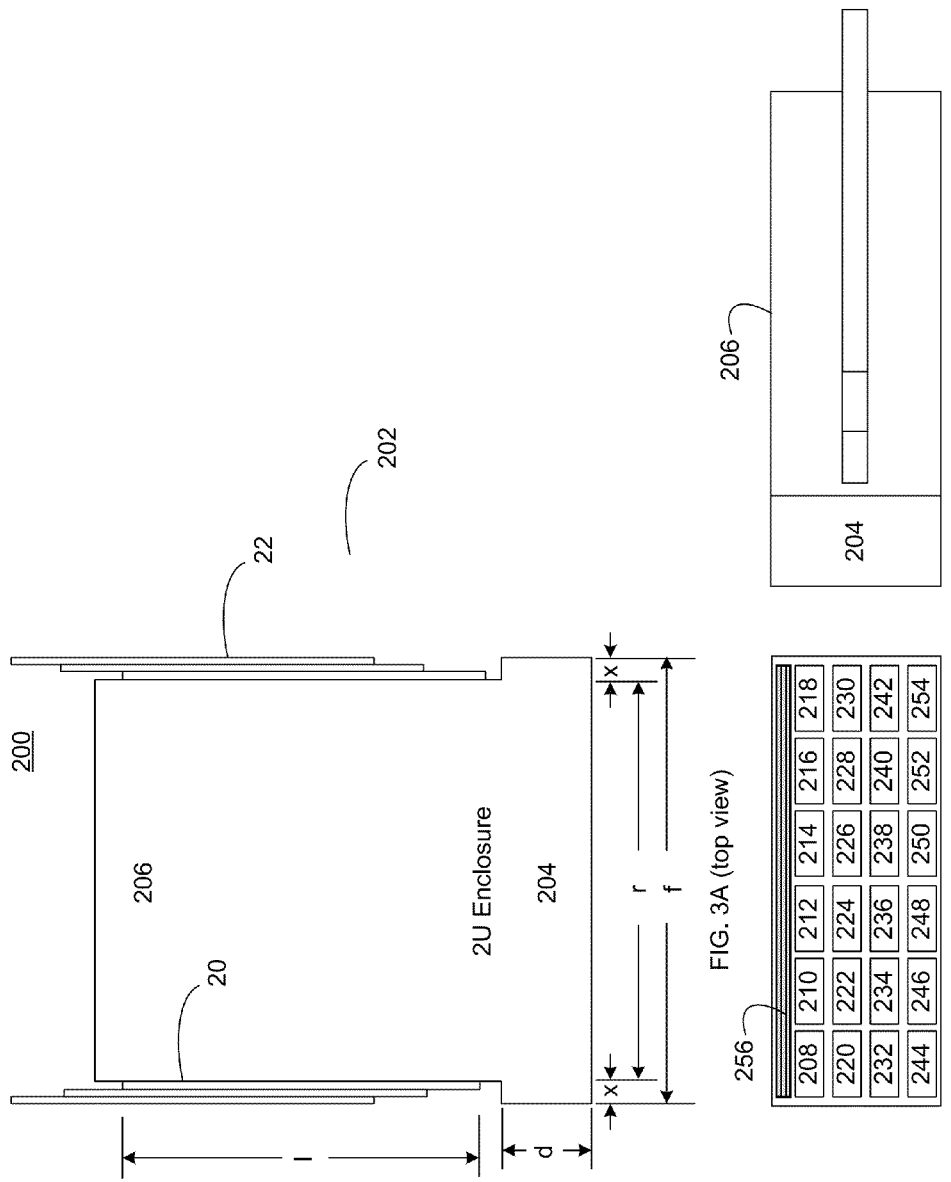

RACK-MOUNTABLE IT DEVICE

TECHNICAL FIELD

This disclosure relates to IT devices and, more particularly, to rack-mountable IT devices.

BACKGROUND

In today's IT infrastructure, high availability is of paramount importance. Specifically, critical (and sometimes non-critical) components within an IT infrastructure are often layered in redundancy. For example, primary servers may be supported by backup servers; primary switches may be supported by backup switches; primary power supplies may be supported by backup power supplies; and primary storage systems may be supported by backup storage systems.

Oftentimes, various IT devices are mounted within IT racks and need to be serviced in the field. Naturally, the quicker these devices can be serviced, the less downtime for the device. Some IT devices are designed in a manner that makes servicing them in the field comparatively easy, in that they are mounted on slide assemblies to allow them to slide into and out of the IT racks. Unfortunately, the width of these slide assemblies takes up valuable real estate, resulting in the overall width of the device enclosure needing to be reduced.

SUMMARY OF DISCLOSURE

In one implementation, an IT chassis, configured to house IT componentry, includes a forward portion having a forward portion width and a rearward portion having a rearward portion width that is narrower than the forward portion width. A first side of the rearward portion is configured to engage a first slide assembly having a first slide width. A second side of the rearward portion is configured to engage a second slide assembly having a second slide width. The sum of the rearward portion width, the first slide width and the second slide width is substantially equal to the forward portion width.

One or more of the following features may be included. The IT componentry housed within the IT chassis may include components of one or more of: a server system, a disk array system, a storage processor system, a storage processor/disk system, and a battery backup system. The rearward portion may include: a first trough having a first depth that is configured to receive the first slide assembly and a second trough having a second depth that is configured to receive the second slide assembly. The first depth may be substantially equal to the first slide width and the second depth may be substantially equal to the second slide width. The first and second slide assemblies may include a plurality of subportions. The IT chassis may be configured to be mounted within an IT rack. The IT rack may include a plurality of rails. The first slide assembly may be configured to engage a first rail of the plurality of rails and the second slide assembly may be configured to engage a second rail of the plurality of rails. The plurality of rails may be NEMA rails. The IT chassis may be a 1U enclosure that is configured to receive twelve horizontal disk drives. The IT chassis may be a 2U enclosure that is configured to receive twenty-four horizontal disk drives.

In another implementation, a full-width, slidable IT device includes IT componentry and an IT chassis configured to house the IT componentry. The IT chassis includes a forward portion having a forward portion width and a rearward portion having a rearward portion width that is narrower than the forward portion width. A first side of the rearward portion is configured to engage a first slide assembly having a first slide width. A second side of the rearward portion is configured to engage a second slide assembly having a second slide width. The sum of the rearward portion width, the first slide width and the second slide width is substantially equal to the forward portion width.

One or more of the following features may be included. The IT componentry may include components of one or more of: a server system, a disk array system, a storage processor system, a storage processor/disk system, and a battery backup system. The rearward portion may include a first trough having a first depth that is configured to receive the first slide assembly and a second trough having a second depth that is configured to receive the second slide assembly. The first depth may be substantially equal to the first slide width and the second depth may be substantially equal to the second slide width. The first and second slide assemblies may include a plurality of subportions. The full-width, slidable IT device may be configured to be mounted within an IT rack. The IT rack may include a plurality of rails. The first slide assembly may be configured to engage a first rail of the plurality of rails and the second slide assembly may be configured to engage a second rail of the plurality of rails. The plurality of rails may be NEMA rails. The IT chassis may be a 1U enclosure that is configured to receive twelve horizontal disk drives. The IT chassis may be a 2U enclosure that is configured to receive twenty-four horizontal disk drives.

In another implementation, a full-width, slidable IT device includes: IT componentry and an IT chassis configured to house the IT componentry. The IT chassis includes a forward portion having a forward portion width and a rearward portion having a rearward portion width that is narrower than the forward portion width. A first slide assembly has a first slide width and is configured to engage a first side of the rearward portion. A second slide assembly has a second slide width and is configured to engage a second side of the rearward portion. The sum of the rearward portion width, the first slide width and the second slide width is substantially equal to the forward portion width.

One or more of the following features may be included. The IT componentry may include components of one or more of: a server system, a disk array system, a storage processor system, a storage processor/disk system, and a battery backup system. The rearward portion may include a first trough having a first depth that is configured to receive the first slide assembly and a second trough having a second depth that is configured to receive the second slide assembly. The first depth may be substantially equal to the first slide width and the second depth may be substantially equal to the second slide width. The full-width, slidable IT device may be configured to be mounted within an IT rack. The IT chassis may be a 1U enclosure that is configured to receive twelve horizontal disk drives. The IT chassis may be a 2U enclosure that is configured to receive twenty-four horizontal disk drives.

The details of one or more implementations are set forth in the accompanying drawings and the description below. Other features and advantages will become apparent from the description, the drawings, and the claims.

BRIEF DESCRIPTION OF THE DRAWINGS

FIGS. 2A-2C are diagrammatic views of a full-width slidable IT device for mounting within the IT rack of FIG. 1;
and
FIG. 2D is a diagrammatic view of an alternative embodiment full-width slidable IT device for mounting within the IT rack of FIG. 1;
and FIGS. 3A-3C are diagrammatic views of an alternative embodiment full-width slidable IT device for mounting within the IT rack of FIG. 1.

Like reference symbols in the various drawings indicate like elements.

DETAILED DESCRIPTION OF THE PREFERRED EMBODIMENTS

Figure 1:
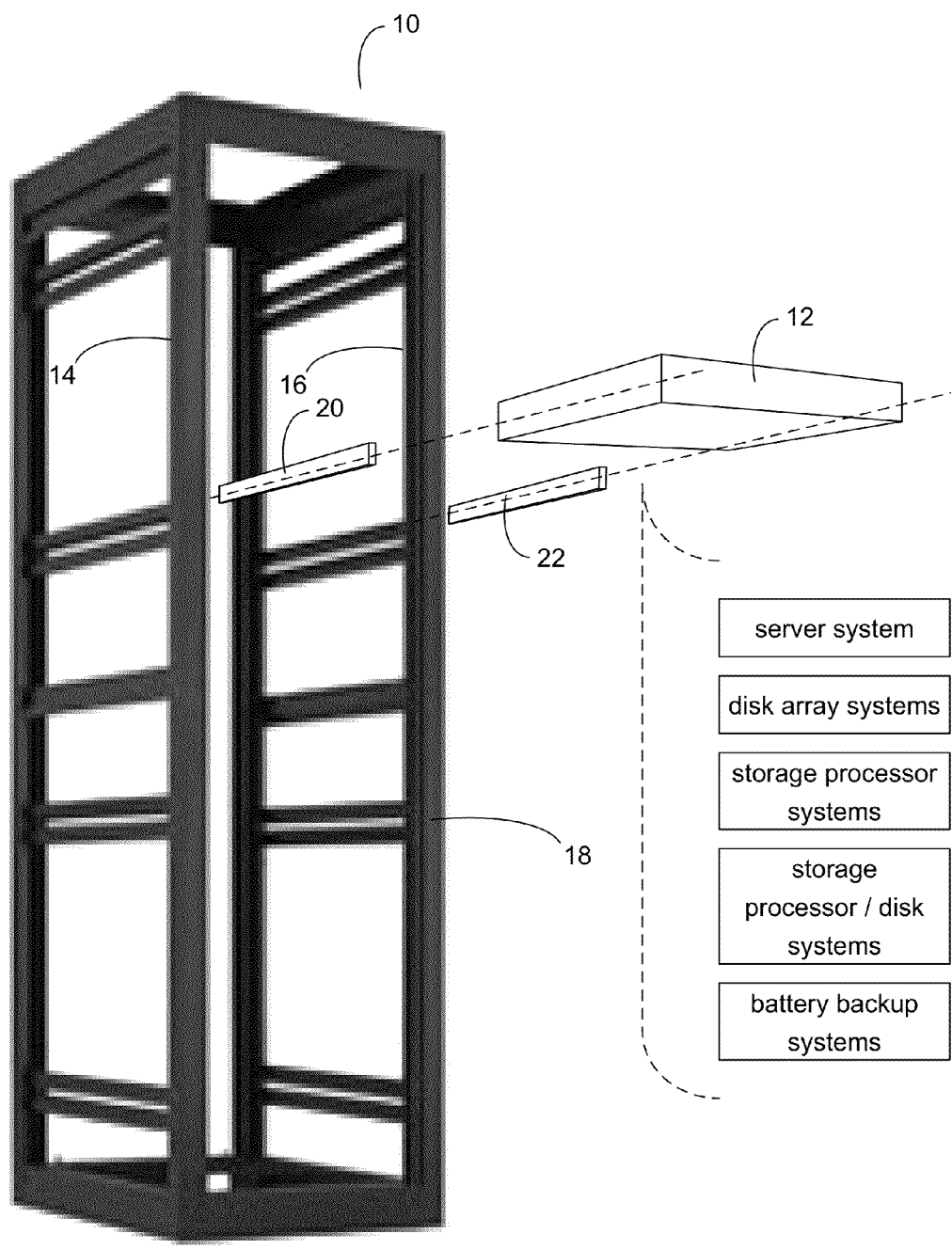
FIG. 1 is a perspective view of an IT rack and an IT device.

Referring to FIG. 1, IT racks (e.g., IT rack 10) may be utilized to store and organize IT devices. For example, IT rack 10 may be placed within a computer room and various IT devices (e.g., IT device 12) may be attached to rails (e.g., NEMA rails 14, 16) included within IT rack 10, wherein these rails (e.g., NEMA rails 14, 16) may have a standard and defined spacing between them (e.g., 19"). Typically, IT devices that are configured to fit within IT rack 10 may be described as rack-mountable IT devices.

Examples of the various IT devices (e.g., IT device 12) mountable within IT rack 10 may include but are not limited to: server systems, disk array systems, storage processor systems, storage processor/disk systems, and battery backup systems.

IT rack 10 may include frame 18 (which may include one or more vertical supports, horizontal supports, and cross braces) to which NEMA rails 14, 16 may be attached. NEMA rails 14, 16 may include a plurality of evenly spaced holes that may be configured for mounting the various IT devices within IT rack 10. By standardizing the spacing between NEMA rails 14, 16, the various IT devices that fit within a first IT rack may also fit within a second IT rack.

Typically, IT racks are defined in accordance with the number of rack units (U's) included within the rack. For example, a 1U IT device is half as high as a 2U IT device, which is half as high as a 4U IT device. Accordingly, while the number of rack units available within a particular IT rack may be rigidly defined by the size of the IT rack, the number of IT devices mountable within that IT rack may vary depending upon the size (in rack units) of the particular IT devices being mounted within that IT rack. Therefore, by reducing the number of rack units that a particular IT device uses within an IT rack, additional IT computing devices may be mounted within the IT rack.

Oftentimes, positioned between NEMA rails 14, 16 and the IT device (e.g., IT device 12) are slide assemblies (e.g., slide assemblies 20, 22) that may allow IT device 12 to slide into and out of IT rack 10. Since slide assemblies 20, 22 may each have a thickness of between ¼" and ⅜", the use of slide assemblies 20, 22 may require that the chassis of IT device 12 be made narrower by the combined thickness of slide assemblies 18, 20 (e.g., for a total of between ½" and ¾" narrower) to allow the assembled combination of IT device 12 and slide assemblies 18, 20 to fit within and be attached to the rails (e.g., NEMA rails 14, 16), which (as discussed above) may be spaced a standard distance apart (e.g., 19").

Referring also to FIGS. 2A (top view), 2B (front view) and 2C (side view), there is shown full-width, slidable IT device 100 that may be configured to provide maximum space for componentry between the above-described NEMA rails, while still being configured to be slidable within the above-described IT rack, thus allowing for enhanced serviceability. Full-width, slidable IT device 100 may include a chassis 102 including two portions, namely forward portion 104 and reward portion 106. As discussed above, examples of full-width, slidable IT device 100 may include but are not limited to: server systems, disk array systems, storage processor systems, storage processor/disk systems, and battery backup systems. Forward portion 104 of chassis 102 may be configured to fit snuggly between NEMA rails 14, 16, while rearward portion 106 of chassis 102 may be configured to be narrower than forward portion 104 by the combined width (e.g., two times dimension "x") of slide assemblies 20, 22. For example, forward portion 104 of chassis 102 may have a width of 17.60 inches (e.g., dimension "f"), while rearward portion 106 of chassis 102 may have a reduced width of 17.10 inches (e.g., dimension "r"), wherein each of slide assemblies 20, 22 may have a width of 0.25 inches (for a total of 0.50 inches). Accordingly, when slide assemblies 20, 22 are attached to rearward portion 106 of chassis 102, the total width of rearward portion 106 (inclusive of slide assemblies 20, 22) would be 17.10 inches (for rearward portion 106 of chassis 102)+0.25 inches (for rail assembly 20)+0.25 inches (for rail assembly 22) for a total of 17.60 inches (i.e., which is substantially the same width as forward portion 104). While the total width of rearward portion 106 (inclusive of slide assemblies 20, 22) need not be identical to the width of forward portion 104, the two widths should be substantially close to within normal mechanical tolerances e.g., so that rearward portion 106 with slide assemblies 20, 22 would fit/be mountable within IT rack 10. Further, since forward portion 104 is 17.60 inches wide, forward portion 104 may internally accommodate 0.50 inches of additional componentry, examples of which may include but are not limited to: disk drives (e.g., disk drive assemblies 106, 108, 110, 112, 114, 116, 118, 120, 122, 124, 126, 128); circuit boards (not shown); power supplies (not shown); memory modules (not shown); and backup batteries (not shown).

In this particular configuration, chassis 102 is a 1U chassis and is shown to include six stacks of two 2.5" disk drives (e.g., disk drive assemblies 106, 108, 110, 112, 114, 116, 118, 120, 122, 124, 126, 128). As discussed above, since forward portion 104 is 17.60 inches wide, forward portion 104 may internally accommodate 0.50 inches of additional componentry, which is enough additional width to allow the sixth stack of two disk drives to fit within chassis 102 (i.e., a 1U enclosure). In such a configuration, the front face of chassis 102 may include cooling passage 130 that may be configured to allow for the circulation of air into or out of chassis 102.

The depth (e.g., dimension "d") of forward portion 104 of chassis 102 may be sized to accommodate specific componentry. For example, if forward portion 104 of chassis 102 is being configured to receive twelve disk drive assemblies (e.g., disk drive assemblies 106, 108, 110, 112, 114, 116, 118, 120, 122, 124, 126, 128), the depth (e.g., dimension "d") of forward portion 104 of chassis 102 may be sized to receive disk drive assemblies 106, 108, 110, 112, 114, 116, 118, 120, 122, 124, 126, 128 plus whatever hot-swappable frames/connectors may be used to electrically couple disk drive assemblies 106, 108, 110, 112, 114, 116, 118, 120, 122, 124, 126, 128 to componentry included within rearward portion 106 of chassis 102. Naturally, the greater the depth (e.g., dimension "d") of forward portion 104 of chassis 102, the shorter the length (e.g., dimension "l") of slide assemblies 20, 22. Accordingly, slide assemblies 20, 22 may be configured to have more than two subsections. For example and in the embodiment shown in FIGS. 2A, 2B, 2C, slide assemblies 20, 22 are shown to include three subsections (e.g., subsections 20A, 20B, 20C), wherein the number of subsections may be increased or decreased to accommodate an increase or decrease in the depth (e.g., dimension "d") of forward portion 104 of chassis 102.

While rearward portion 106 of chassis 102 is shown to be stepped with respect to forward portion 104 (i.e., the entirety of rearward portion 106 has a width of e.g., 17.10 inches), this is for illustrative purposes only, as other configurations are possible and are considered to be within the scope of this disclosure. For example and referring also to FIG. 2D, there is shown an alternative embodiment of full-width slidable IT device 100 (namely full-width slidable IT device 100') in which rearward portion 106' of chassis 102' may simply be configured to accommodate slide assemblies 20, 22 so that when slide assemblies 20, 22 are attached to rearward portion 106' of chassis 102', the total width of rearward portion 106' (inclusive of slide assemblies 20, 22) would be 17.60 inches (i.e., the same width as forward portion 104).

For example and in this alternative embodiment, rearward portion 106' of chassis 102' may include a plurality of troughs (e.g., troughs 150, 152) sized to receive slide assemblies 20, 22 so that when slide assemblies 20, 22 are received within troughs 150, 152, the total width of rearward portion 106' (inclusive of slide assemblies 20, 22) would be 17.60 inches. Accordingly, the depth of each of troughs 150, 152 may be equal to the thickness of each of slide assemblies 20, 22 (namely dimension "x" of FIG. 2A). Therefore, rearward portion 106' of chassis 102' may be configured to be narrower than forward portion 104' by the combined width of slide assemblies 20, 22, but only when measured at the base of troughs 150, 152. Accordingly, the areas of rearward portion 106' directly above (e.g., area 154) and directly below (e.g., area 156) troughs 150, 152 may be the same width as forward portion 106', thus allowing for additional componentry to be positioned within areas 154, 156.

Referring also to FIGS. 3A (top view), 3B (front view) and 3C (side view), there is shown an alternative embodiment full-width, slidable IT device 200 that may also be configured to provide maximum space for componentry between the above-described NEMA rails, while still being configured to be slidable within the above-described IT rack, thus allowing for enhanced serviceability. Full-width, slidable IT device 200 may include a chassis 202 including two portions, namely forward portion 204 and reward portion 206, wherein forward portion 204 of chassis 202 may be configured to fit snuggly between NEMA rails 14, 16, while rearward portion 206 of chassis 202 may be configured to be narrower than forward portion 204 by the combined width (e.g., two times dimension "x") of slide assemblies 20, 22. Again, since forward portion 204 is 17.60 inches wide, forward portion 204 may internally accommodate 0.50 inches of additional componentry, examples of which may include but are not limited to: disk drives (e.g., disk drive assemblies 208, 210, 212, 214, 216, 218, 220, 222, 224, 226, 228, 230, 232, 234, 236, 238, 240, 242, 244, 246, 248, 250, 252, 254); circuit boards (not shown); power supplies (not shown); memory modules (not shown); and backup batteries (not shown).

In this particular configuration, chassis 202 is a 2U chassis and is shown to include six stacks of four 2.5" disk drives (e.g., disk drive assemblies 208, 210, 212, 214, 216, 218, 220, 222, 224, 226, 228, 230, 232, 234, 236, 238, 240, 242, 244, 246, 248, 250, 252, 254). As discussed above, since forward portion 204 is 17.60 inches wide, forward portion 204 may internally accommodate 0.50 inches of additional componentry, which is enough additional width to allow the sixth stack of four disk drives to fit within chassis 202 (i.e., a 2U enclosure). In such a configuration, the front face of chassis 202 may include cooling passage 256 that may be configured to allow for the circulation of air into or out of chassis 202.

Having thus described the disclosure of the present application in detail and by reference to embodiments thereof, it will be apparent that modifications and variations are possible without departing from the scope of the disclosure defined in the appended claims.

What is claimed is:

1. An IT chassis configured to house IT componentry comprising:
   a forward portion having a forward portion width;
   a rearward portion having a rearward portion width that is narrower than the forward portion width, wherein:
      a first side of the rearward portion is configured to engage a first slide assembly having a first slide width; and
      a second side of the rearward portion is configured to engage a second slide assembly having a second slide width;
   wherein the sum of the rearward portion width, the first slide width and the second slide width is substantially equal to the forward portion width.

2. The IT chassis of claim 1 wherein the IT componentry housed within the IT chassis includes components of one or more of: a server system, a disk array system, a storage processor system, a storage processor/disk system, and a battery backup system.

3. The IT chassis of claim 1 wherein the rearward portion includes:
   a first trough having a first depth that is configured to receive the first slide assembly; and
   a second trough having a second depth that is configured to receive the second slide assembly;
   wherein the first depth is substantially equal to the first slide width and the second depth is substantially equal to the second slide width.

4. The IT chassis of claim 1 wherein the first and second slide assemblies include a plurality of subportions.

5. The IT chassis of claim 1 wherein the IT chassis is configured to be mounted within an IT rack.

6. The IT chassis of claim 5 wherein the IT rack includes a plurality of rails.

7. The IT chassis of claim 6 wherein:
   the first slide assembly is configured to engage a first rail of the plurality of rails; and
   the second slide assembly is configured to engage a second rail of the plurality of rails.

8. The IT chassis of claim 6 wherein the plurality of rails are NEMA rails.

9. The IT chassis of claim 1 wherein the IT chassis is a 1U enclosure that is configured to receive twelve horizontal disk drives.

10. The IT chassis of claim 1 wherein the IT chassis is a 2U enclosure that is configured to receive twenty-four horizontal disk drives.

11. A full-width, slidable IT device comprising:
   IT componentry; and
   an IT chassis configured to house the IT componentry, the IT chassis including:
      a forward portion having a forward portion width,
      a rearward portion having a rearward portion width that is narrower than the forward portion width, wherein:
         a first side of the rearward portion is configured to engage a first slide assembly having a first slide width; and
         a second side of the rearward portion is configured to engage a second slide assembly having a second slide width,
      wherein the sum of the rearward portion width, the first slide width and the second slide width is substantially equal to the forward portion width.

12. The full-width, slidable IT device of claim 11 wherein the IT componentry includes components of one or more of:

a server system, a disk array system, a storage processor system, a storage processor/disk system, and a battery backup system.

13. The full-width, slidable IT device of claim 11 wherein the rearward portion includes:
   a first trough having a first depth that is configured to receive the first slide assembly; and
   a second trough having a second depth that is configured to receive the second slide assembly;
   wherein the first depth is substantially equal to the first slide width and the second depth is substantially equal to the second slide width.

14. The full-width, slidable IT device of claim 11 wherein the first and second slide assemblies include a plurality of subportions.

15. The full-width, slidable IT device of claim 11 wherein the full-width, slidable IT device is configured to be mounted within an IT rack.

16. The full-width, slidable IT device of claim 15 wherein the IT rack includes a plurality of rails.

17. The full-width, slidable IT device of claim 16 wherein:
   the first slide assembly is configured to engage a first rail of the plurality of rails; and
   the second slide assembly is configured to engage a second rail of the plurality of rails.

18. The full-width, slidable IT device of claim 16 wherein the plurality of rails are NEMA rails.

19. The full-width, slidable IT device of claim 11 wherein the IT chassis is a 1U enclosure that is configured to receive twelve horizontal disk drives.

20. The full-width, slidable IT device of claim 11 wherein the IT chassis is a 2U enclosure that is configured to receive twenty-four horizontal disk drives.

21. A full-width, slidable IT device comprising:
   IT componentry;
   an IT chassis configured to house the IT componentry, the IT chassis including:
      a forward portion having a forward portion width, and
      a rearward portion having a rearward portion width that is narrower than the forward portion width;
   a first slide assembly having a first slide width and configured to engage a first side of the rearward portion; and
   a second slide assembly having a second slide width and configured to engage a second side of the rearward portion;
   wherein the sum of the rearward portion width, the first slide width and the second slide width is substantially equal to the forward portion width.

22. The full-width, slidable IT device of claim 21 wherein the IT componentry includes components of one or more of: a server system, a disk array system, a storage processor system, a storage processor/disk system, and a battery backup system.

23. The full-width, slidable IT device of claim 21 wherein the rearward portion includes:
   a first trough having a first depth that is configured to receive the first slide assembly; and
   a second trough having a second depth that is configured to receive the second slide assembly;
   wherein the first depth is substantially equal to the first slide width and the second depth is substantially equal to the second slide width.

24. The full-width, slidable IT device of claim 21 wherein the full-width, slidable IT device is configured to be mounted within an IT rack.

25. The full-width, slidable IT device of claim 21 wherein the IT chassis is a 1U enclosure that is configured to receive twelve horizontal disk drives.

26. The full-width, slidable IT device of claim 21 wherein the IT chassis is a 2U enclosure that is configured to receive twenty-four horizontal disk drives.

* * * * *